United States Patent
Jarosinski

(10) Patent No.: US 8,499,021 B2
(45) Date of Patent: Jul. 30, 2013

(54) CIRCUIT AND METHOD FOR COMPUTING CIRCULAR CONVOLUTION IN STREAMING MODE

(75) Inventor: Tadeusz Jarosinski, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 528 days.

(21) Appl. No.: 12/868,102

(22) Filed: Aug. 25, 2010

(65) Prior Publication Data

US 2012/0051406 A1 Mar. 1, 2012

(51) Int. Cl.
*G06F 17/15* (2006.01)

(52) U.S. Cl.
USPC .......................................... 708/421; 708/316

(58) Field of Classification Search
USPC ................... 708/315–316, 420–421
See application file for complete search history.

(56) References Cited

U.S. PATENT DOCUMENTS

| | | | | |
|---|---|---|---|---|
| 4,254,417 A | * | 3/1981 | Speiser | 342/368 |
| 4,672,220 A | * | 6/1987 | Haberl | 348/294 |
| 4,709,344 A | * | 11/1987 | Crawford | 708/312 |
| 5,053,983 A | * | 10/1991 | Hyatt | 708/306 |
| 5,155,816 A | * | 10/1992 | Kohn | 712/205 |
| 6,125,155 A | * | 9/2000 | Lesthievent et al. | 375/350 |
| 6,208,671 B1 | * | 3/2001 | Paulos et al. | 370/545 |
| 6,377,968 B1 | * | 4/2002 | Nakase et al. | 708/319 |
| 6,968,352 B1 | * | 11/2005 | Gilloire et al. | 708/300 |
| 7,587,441 B2 | * | 9/2009 | Yancey et al. | 708/319 |
| 7,590,676 B1 | * | 9/2009 | Langhammer | 708/319 |
| 7,908,306 B1 | * | 3/2011 | Chieng et al. | 708/300 |
| 2002/0001340 A1 | | 1/2002 | Shenoi et al. | |
| 2002/0168022 A1 | | 11/2002 | Kim | |
| 2003/0063660 A1 | | 4/2003 | Shenoi et al. | |
| 2004/0114691 A1 | | 6/2004 | Kim | |
| 2006/0040611 A1 | | 2/2006 | Ding et al. | |
| 2008/0225930 A1 | | 9/2008 | Proctor et al. | |
| 2008/0232241 A1 | | 9/2008 | Proctor et al. | |
| 2009/0061766 A1 | | 3/2009 | Ding et al. | |
| 2010/0293214 A1 | * | 11/2010 | Longley | 708/313 |

FOREIGN PATENT DOCUMENTS

GB 1554064 A 10/1979

OTHER PUBLICATIONS

International Search Report and Written Opinion—PCT/US2011/049150—ISA/EPO—Oct. 30, 2012.
Stein J., "Digital Signal Processing, A Computer Science Perspective: chapter 15 Digital Filter Implementation", Digital Signal Processing, XX, XX, Jan. 1, 2000, pp. 569-604, XP002331840, DOI: 10.1002/047120059X.CH15 p. 570.

\* cited by examiner

*Primary Examiner* — Chuong D Ngo
*Assistant Examiner* — Kevin G Hughes

(57) ABSTRACT

A circuit and method for computing the circular convolution of an input signal with a finite impulse response operates to store initial input samples of the input signal, perform convolution of the remaining input samples in the block of input samples and then supplying the stored initial input samples for convolution, thereby generating circular convolution output samples.

13 Claims, 7 Drawing Sheets

CIRCUIT AND METHOD FOR COMPUTING CIRCULAR CONVOLUTION IN STREAMING MODE

BACKGROUND

1. Field

This disclosure generally relates to circuit for computing circular convolution.

2. Background

Convolution is an algorithm in digital signal processing used to construct the output of a system for any arbitrary input signal by analyzing the impulse response of the system. In general, for a linear system, convolution is used to describe the relationship between the input signal, the impulse response, and the output signal. Convolution can be performed in the time domain or in the frequency domain. In the time domain, an input signal is convolved with an impulse response to yield an output signal. In the frequency domain, an input spectrum is multiplied by a frequency response of the impulse response to yield an output spectrum.

Circular convolution is useful for computing the linear convolution of an input sequence where the input data is of indefinite duration or the input sequence has a length exceeding a practical value for computation. For instance, the input signal may be streaming data or a signal in streaming mode. To perform circular convolution on input samples in streaming mode, the input samples are broken up into blocks. The result of convolving the initial samples (the impulse response width) has to be added to the convolved samples at the end of the block. That is, the convolution result of the initial samples is to be added to the convolution result of the samples at the end of the block, so called the causal part.

Circular convolution of blocks of input samples is also referred to as "Block Convolution with Overlap-Add." For instance, block convolution is a process in which the input signal is segmented into sections of length L and is convolved with the Finite Input Response (FIR) in the time domain. The desired linear convolution result is obtained by fitting the filtered sections together, usually using either an overlap-add method or an overlap-save method.

The overlap-add method can be described as follows. First, the input signal is segmented into sections of length L, and each section is convolved with the FIR of length P. The linear convolution of one section of the input signal and the FIR will result in a sequence y[n] of length (L+P−1). When a DFT of length (L+P−1) is used to compute the convolution without time aliasing, the nonzero points in the filtered sections will overlap by (P−1) points, and these overlap points are added together to construct the output signal.

The circular convolution or the block convolution with overlap-add of a streaming input signal is not a contiguous process and requires disjoint convolution (filtering) and summation after both convolution results are obtained. The computation is therefore complex and inefficient to implement.

SUMMARY

According to one embodiment of the present invention, a circuit for computing the circular convolution of an input signal with a finite impulse response includes a first-in-first-out (FIFO) memory circuit configured to store M number of incoming input samples of the input signal in response to a first control signal and to provide stored input samples in response to a second control signal where M is the length of the finite impulse response, a multiplexer configured to receive the incoming input samples of the input signal as a first data input and the stored input samples from the FIFO memory circuit as a second data input and further configured to receive a third control signal as a select signal, where the multiplexer is operative to select either the first data input or the second data input as a data output in response to the select signal. The circuit further includes a controller configured to generate the first, second and third control signals and a convolve circuit configured to compute the convolution of the data output of the multiplexer and the finite impulse response, thereby generating circular convolution output samples. The convolution is performed on blocks of N number of input samples of the input signal where N is greater than M. In operation, the controller is operative to generate the first control signal to cause the initial M input samples of each block of N input samples to be stored in the FIFO memory circuit as the stored input samples, to generate the third control signal to cause the (M+1)th to Nth input samples of each block to be provided to the convolve circuit for computing the convolution and after the Nth input sample of each block, to generate the second control signal to cause the M stored input samples to be provided to the convolve circuit for convolution with the finite impulse response.

According to another aspect of the present invention, a method for computing the circular convolution of an input signal with a finite impulse response includes receiving incoming input samples of the input signal, storing initial M incoming input samples in a first-in-first-out manner where M is the length of the finite impulse response, providing the (M+1)th to Nth incoming input samples for convolution with the finite impulse response where the convolution is performed on blocks of N number of input samples of the input signal and N is greater than M, and providing the M stored input samples in a first-in-first-out manner for convolution with the finite impulse response, thereby generating circular convolution output samples.

DETAILED DESCRIPTION

The nature, objectives, and advantages of the disclosed method and apparatus will become more apparent to those skilled in the art after considering the following detailed description in connection with the accompanying drawings.

According to embodiments of the present invention, a circular convolution circuit buffers a predetermined number of initial samples in a FIFO (First-In-First-Out) memory and feeds those buffered initial samples at the end of the convolution process. The circular convolution is therefore able to achieve the same mathematical result with a simple circuit.

Figure 1:
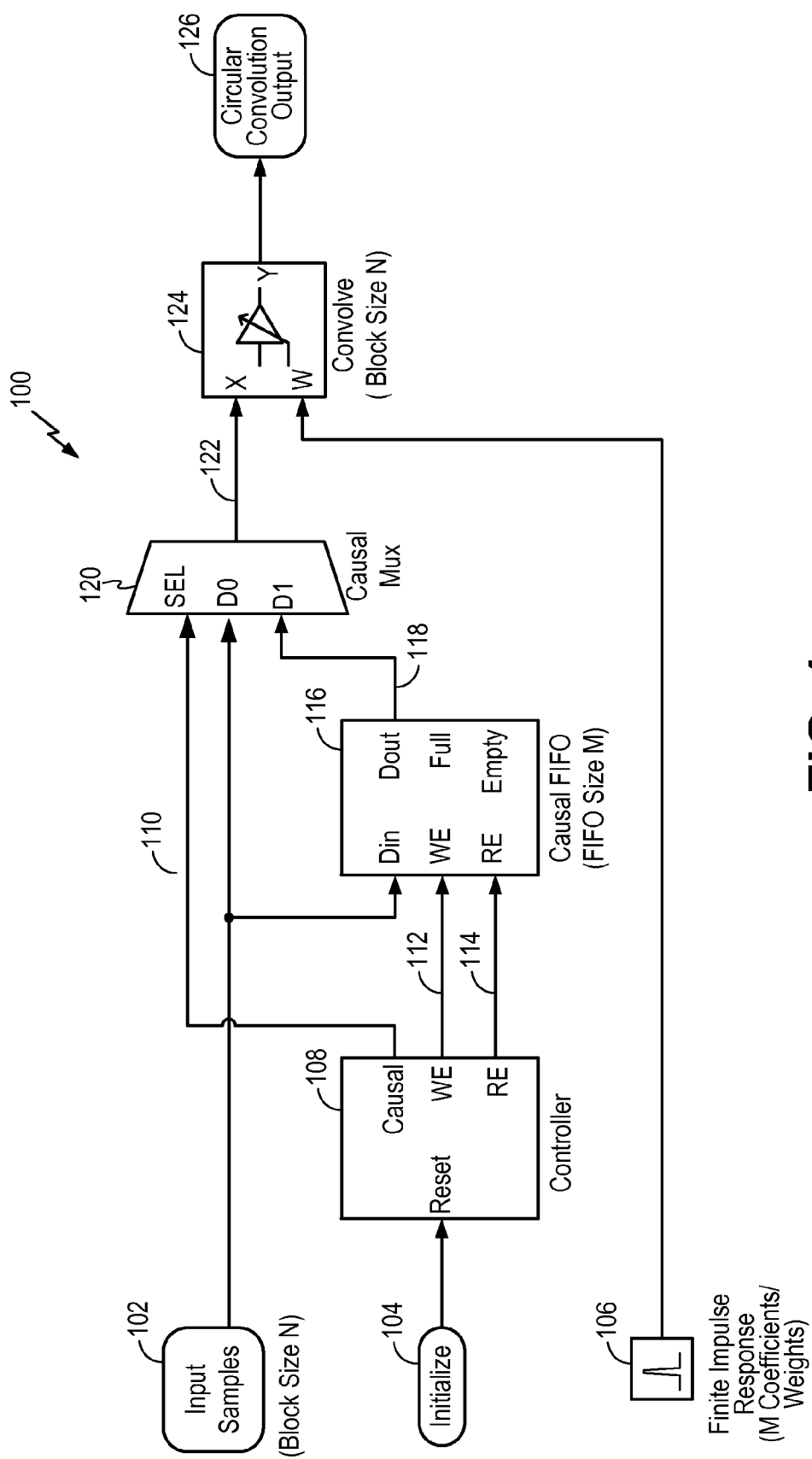
FIG. 1 is a schematic diagram of a circular convolution circuit according to one embodiment of the present invention.

FIG. 1 is a schematic diagram of a circular convolution circuit according to one embodiment of the present invention. Referring to FIG. 1, a circular convolution circuit 100 receives samples of an input signal (input samples 102) and also receives a finite impulse response (FIR 106). Input samples 102 are time domain signals grouped in blocks of N samples. For instance, input samples 102 can be signals generated by other signal processing operations. For example, input samples 102 can be generated from an IFFT (Inverse Fast Fourier Transform) operation having an IFFT block size of N. The finite impulse response 106 has M coefficients or weights. In general, M is less than N. In one embodiment, N is greater than or equal to 2M. In one exemplary embodiment, N is 1024 while M is 96. The circular convolution circuit 100 generates a circular convolution output signal 126 in blocks of N output samples. In the present embodiment, circular convolution circuit 100 also receives an initialize signal 104 to reset the circuit to start the convolution process.

Circular convolution circuit 100 includes a convolution controller 108 generating the control signals for a FIFO 116 and a multiplexer 120. FIFO 116, also referred to as the Causal FIFO, has a size of M and stores M number of input samples when the write enable (WE) signal 112 is asserted. The stored input samples are read out of FIFO 116 on a first-in-first-out manner when the read enable (RE) signal 114 is asserted. Multiplexer 120, also referred to as a Causal Mux, receives a causal select signal 110 from convolution controller 108 to select between the input samples 102 (D0) and the stored input samples 118 from FIFO 116 (D1). Causal Mux 120 provides the selected input samples 122 to a convolve circuit 124 to be convolved with the FIR 106. In one embodiment, the convolution is performed using FIR filtering in the time domain. Convolve circuit 124 generates the time domain circular convolution output signal 126 by performing FIR filtering of the selected input samples 122 with M coefficients of the FIR 106. In one embodiment, convolve circuit 124 is implemented using an FIR filter operating to convolve the input signal with the finite impulse response (FIR) samples.

Figure 2:
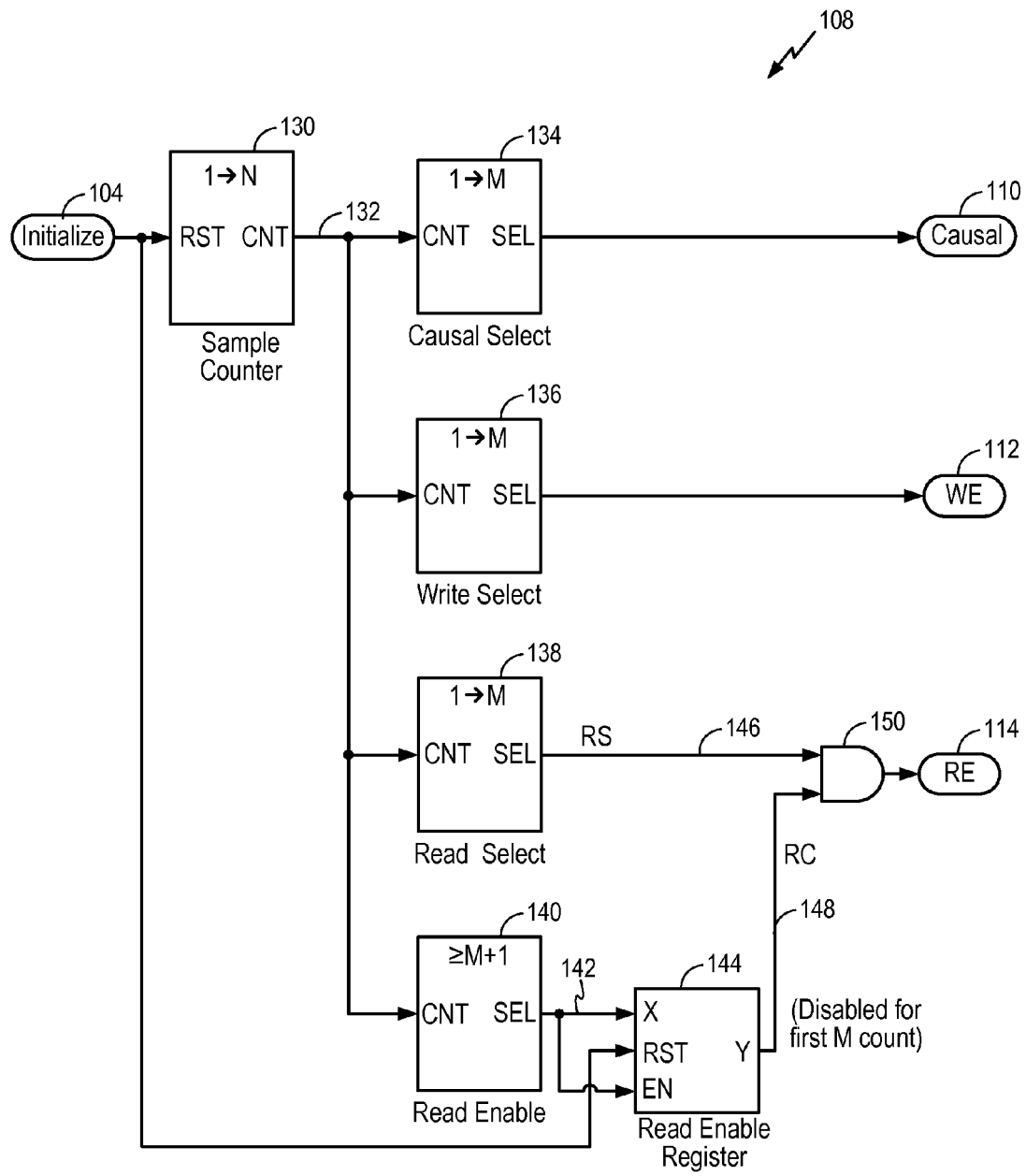
FIG. 2 is a schematic diagram of the convolution controller of FIG. 1 according to one embodiment of the present invention.
Figure 3:
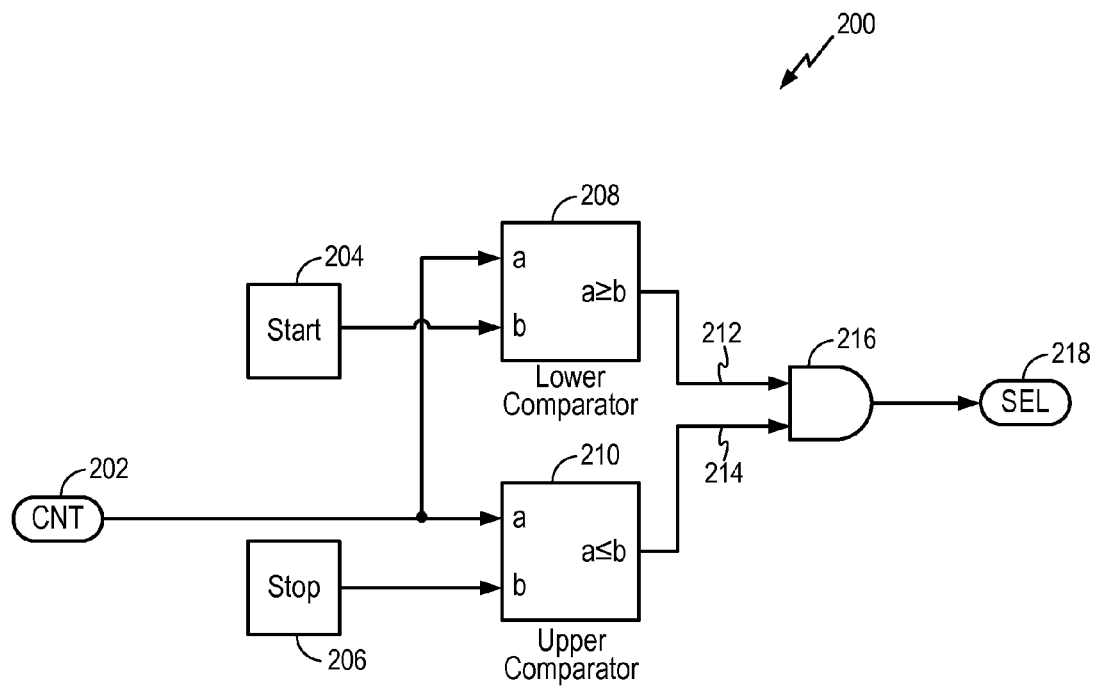
FIG. 3, including
Figure 3A:
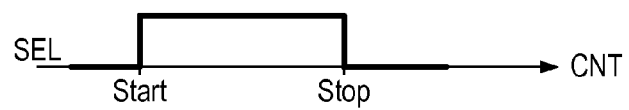
FIG. 3a, is a schematic diagram and signal waveform of a counter block in the convolution controller according to one embodiment of the present invention.

FIG. 2 is a schematic diagram of the convolution controller of FIG. 1 according to one embodiment of the present invention. Referring to FIG. 2, convolution controller 108 includes a sample counter 130 which, upon reset by the Initialize signal 104, counts from 1 to N, N being the input sample block size. The count value (CNT) on a node 132 is supplied to each of four counter blocks 134, 136, 138, 140. In the present embodiment, counter blocks 134, 136, 138, 140 are constructed in an identical manner using the circuit structure shown in FIG. 3. Referring to FIG. 3, a counter block 200 includes a lower comparator 208, an upper comparator 210 and an AND gate 216. The sample count value (node 202) is coupled to one input of both of the comparators 208, 210. The lower comparator 208 receives the start value (node 204) while the upper comparator 210 receives the stop value (node 206). The lower comparator 208 determines if the sample count value is greater than or equal to the start value. The upper comparator 210 determines if the sample count value is less than or equal to the stop value. When both conditions are true, then AND gate 216 asserts its output select signal (node 218). Thus, the output select signal is only asserted during the interval when the sample count value is between the start value and the stop value, as shown in FIG. 3a.

Returning to FIG. 2, counter block 134 is the Causal Select block and generates the causal select signal 110 being the select signal of Causal Mux 120. Causal select block 134 is programmed with a start value of 1 and a stop value of M. Thus, causal select block 134 asserts causal select signal 110 (logical high) when the count value is between 1 and M; otherwise, causal select signal 110 is deasserted (logical low). When the causal select signal 110 is asserted (logical high), the D1 input (stored input samples) of the Causal Mux 120 is selected. When the causal select signal 110 is deasserted (logical low), the D0 input (incoming input samples) of the Causal Mux 120 is selected.

Counter block 136 is the Write Enable (WE) Select block and generates the WE signal 112 being the write enable signal of Causal FIFO 116. WE select block 136 is programmed with a start value of 1 and a stop value of M. Thus, WE select block 136 asserts WE signal 112 (logical high) when the count value is between 1 and M; otherwise, WE signal 112 is deasserted (logical low). When the WE signal 112 is asserted (logical high), input samples at the data input terminal (Din) of FIFO 116 are written into the FIFO in a first-in-first-out manner. When the WE signal 112 is deasserted (logical low), no new input samples are written into FIFO 116.

Counter block 138 is the Read Select block and generates a read select (RS) signal 146. Counter block 140 is the Read Enable block and, together with a Read Enable Register 144, generates a read control (RC) signal 148. The RS signal 146 from the Read select block 138 and the RC signal 148 from the Read Enable block 140 are provided to an AND gate 150 and are logically AND'ed to generate the read enable (RE) signal 114 of Causal FIFO 116. When the RE signal 114 is asserted (logical high), input samples stored in FIFO 116 are read out of the FIFO in a first-in-first-out manner and provided to the data out Dout terminal 118 of the FIFO. When the RE signal 114 is deasserted (logical low), no stored data is being read.

Read select block 138 is programmed with a start value of 1 and a stop value of M. Thus, read select block 138 asserts RS signal 146 (logical high) when the count value is between 1 and M; otherwise, RS signal 146 is deasserted (logical low). Accordingly, RS signal 146 is asserted for the 1 to M samples of every N blocks of input sample. On the other hand, read enable block 140 is programmed with a start value of M+1 and a stop value of an arbitrary large number. Thus, read enable block 140 asserts its output select signal 142 when the count value is greater than M. Read enable register 144 is reset by the initialize signal 104 and is coupled to receive the select signal 142 as the input signal (X) and also the enable signal (EN). Thus, once select signal 142 is asserted, the select signal is stored in the register. The output signal (Y) of the read enable register 144 is the RC signal 148. Accordingly, the RC signal 148 is reset when the initialize signal 104 is asserted and then once the count value exceeds M, the read enable register 144 latches the logical high value and the RC signal is asserted therefore. The RE signal 114 is therefore gated or deasserted for the first block of N input samples due to the RC signal but are subsequently controlled solely by the RS signal from the read select block 138.

Figure 4:
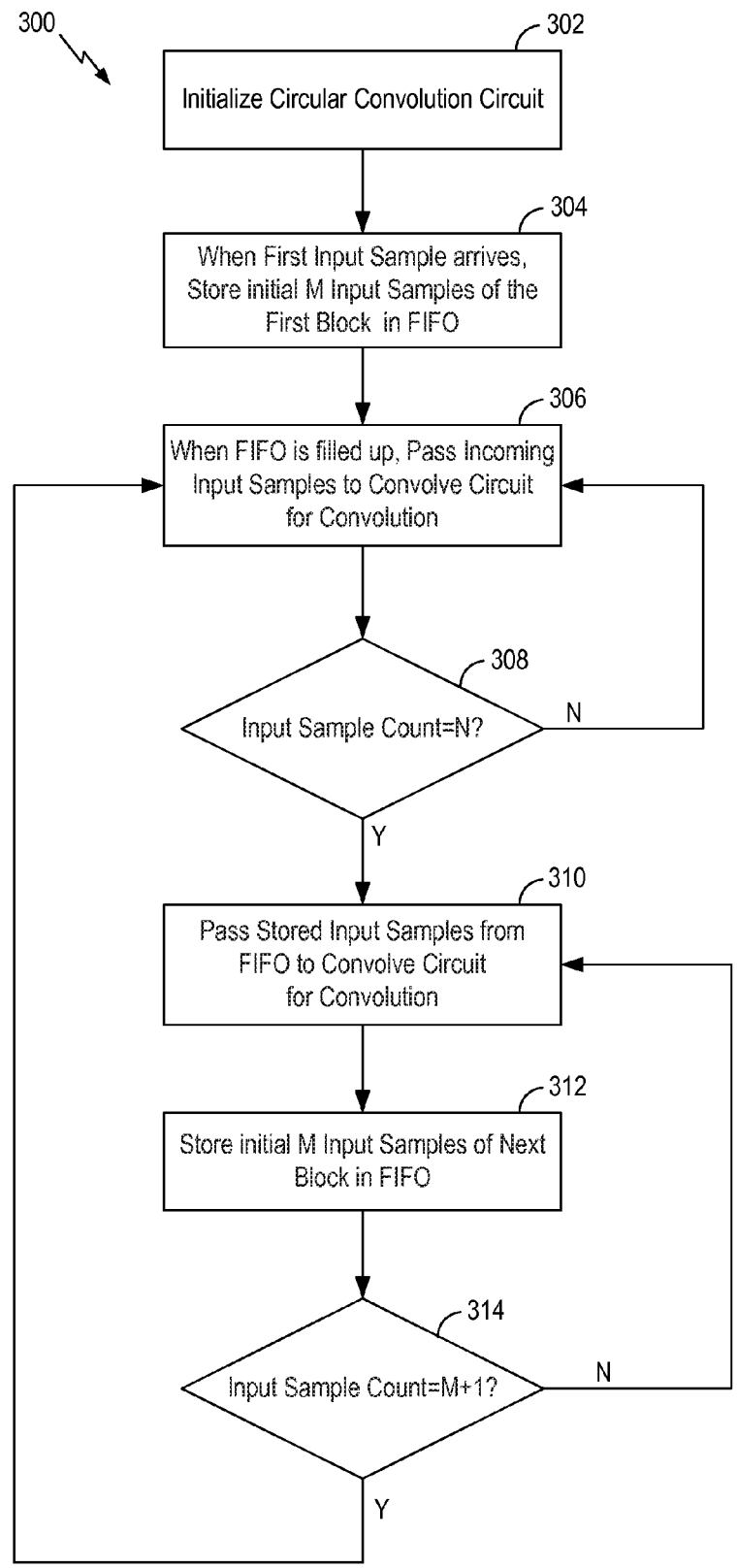
FIG. 4 is a flow chart illustrating the circular convolution method according to one embodiment of the present invention.
Figure 5:
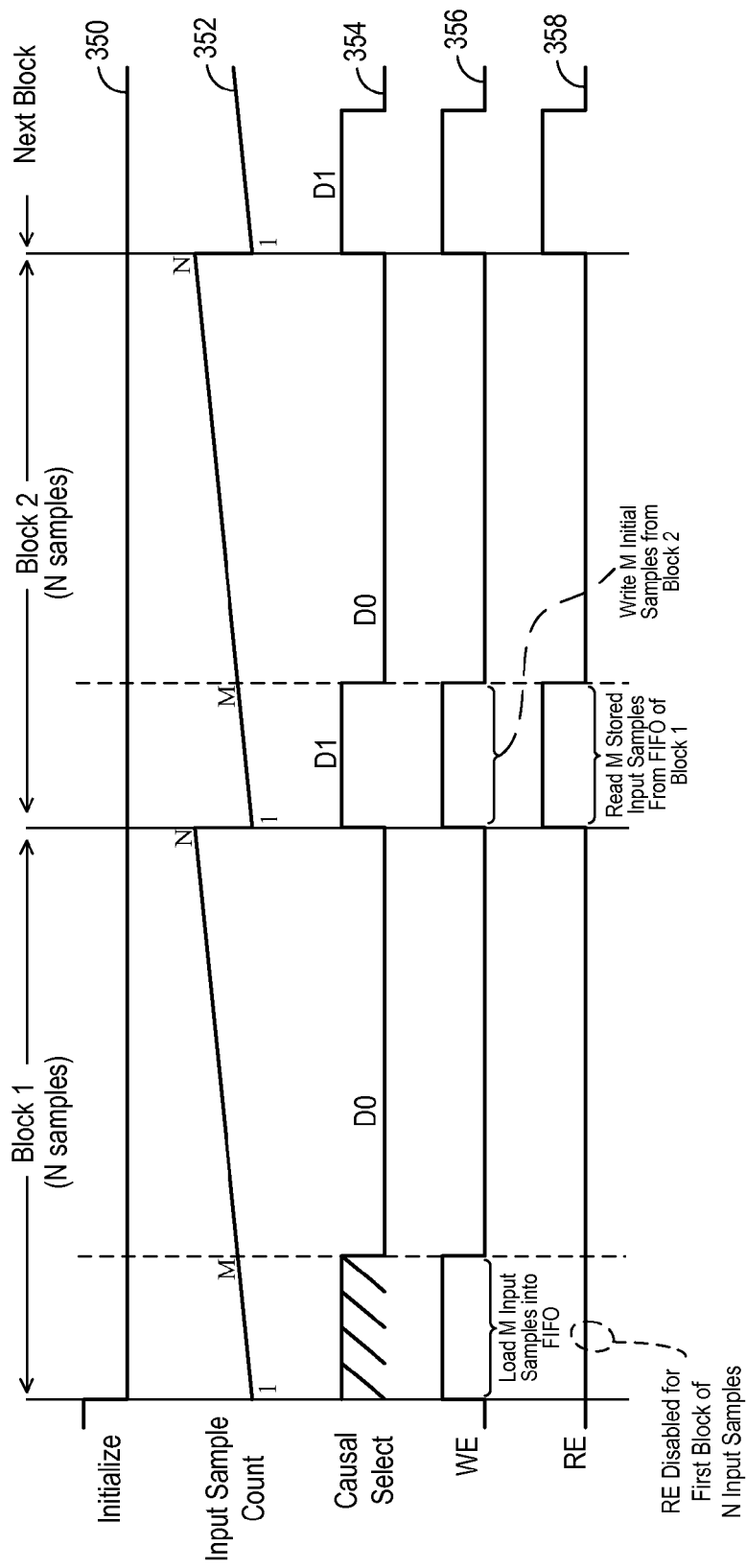
FIG. 5 is a timing diagram of the signals in the circuit convolution circuit of FIG. 1 according to one embodiment of the present invention.

The operation of circular convolution circuit 100 of FIG. 1 will now be described with reference to the flow chart in FIG. 4 and the timing diagram in FIG. 5. Referring to FIG. 4, a circular convolution method 300 implemented in the circular convolution circuit 100 starts by initializing the circular convolution circuit (step 302). Referring to FIG. 1 and FIG. 5, the initialize signal 104 is asserted to reset the convolution controller 108 until the start of the circular convolution process. In one embodiment, the initialize signal 104 is deasserted when the first input sample arrives.

Upon receiving the first input sample, convolution controller 108 causes the first M input samples to be written into FIFO 116 (step 304). More specifically, referring to the timing diagram in FIG. 5, convolution controller 108 asserts the WE signal 112 to FIFO 116. The WE signal 112 is asserted for M input samples. Accordingly, the first M input samples 102 are loaded into FIFO 116. For the very first block of input samples, the state of the causal select signal 110 is not critical because no convolution is carried out during this initial period. In the present embodiment, the convolution controller 108 is configured to assert the causal select signal during the first to M input samples of each block of N samples. Therefore, causal mux 120 selects the D1 input being the stored input samples from FIFO 116. However, during the first block after initialization, convolution controller 108 deasserts the RE signal 114 and therefore, no data is being read out of FIFO 116 and data output Dout does not provide any valid data at this time.

When FIFO 116 is filled up with the first M input samples of the first block, the incoming input samples are then passed to the convolve circuit for convolution (step 306). More specifically, referring to the timing diagram in FIG. 5, convolution controller 108 deasserts the causal select signal (logical low) to causal mux 120 so that the mux selects the D0 data input being the incoming input samples 102. The input samples, sample number from M+1 and on, are provided to convolve circuit 124 for convolution with the FIR signal 106. The convolution process continues until the Nth input sample is reached (step 308).

When the input sample count reaches N being the input sample block size (step 308), that is, at the end of the block, convolution controller 108 causes the stored input samples in FIFO 116 to be passed to the convolve circuit for convolution (step 310). More specifically, referring to the timing diagram in FIG. 5, when the sample count reaches N, convolution controller 108 asserts the causal select signal as well as the RE signal, causing the stored input samples in FIFO 116 to be read out and provided to the D1 data input of causal mux 120 and causing causal mux 120 to select the D1 data input. The stored input samples, which are the initial M input samples of the first or previous block are then provided to the convolve circuit 124 for convolution. At the same time, convolution controller 108 also asserts the WE signal to FIFO 116 so that the initial M samples of the next block are stored into FIFO 116 as the samples from the previous block are being read out (step 312). Steps 310 and 312 are repeated until all of the stored samples from the previous block have been read out of FIFO 116 and FIFO 116 is filled with the M initial input samples of the next block for use to perform convolution at the end of this block. When the input sample count reaches M+1 (step 314), method 300 repeats at step 306 where the incoming input samples are passed to the convolve circuit 124 for convolution and the circular convolution process continues for each block of N input samples.

By storing initial samples of a block and supplying the stored samples for convolution at the end of the block, circular convolution of streaming input data can be computed using a much simpler circuit than the conventional circuits.

According to an alternative embodiment of the present invention, the convolve circuit can be gated until the sample count reaches N−M, being the input sample block size (N) minus the impulse response size (M). In one embodiment, the convolve circuit is gated by gating the FIR filter. Gating the convolve circuit or the FIR filter provides many advantages. First, in some applications, only the output of the circular convolution part of the finite impulse response width is of interest. In that case, the FIR filter can be gated and convolution not performed until for the last M samples of the block, M being the width of the FIR. Second, gating the convolve circuit or the FIR filter can reduce power consumption of the circuit. Third, gating the convolve circuit or the FIR filter for circular convolution allows for sharing of resources. For example, the multipliers in the FIR filter can be used for other processing functions when the FIR filter is gated.

Figure 6:
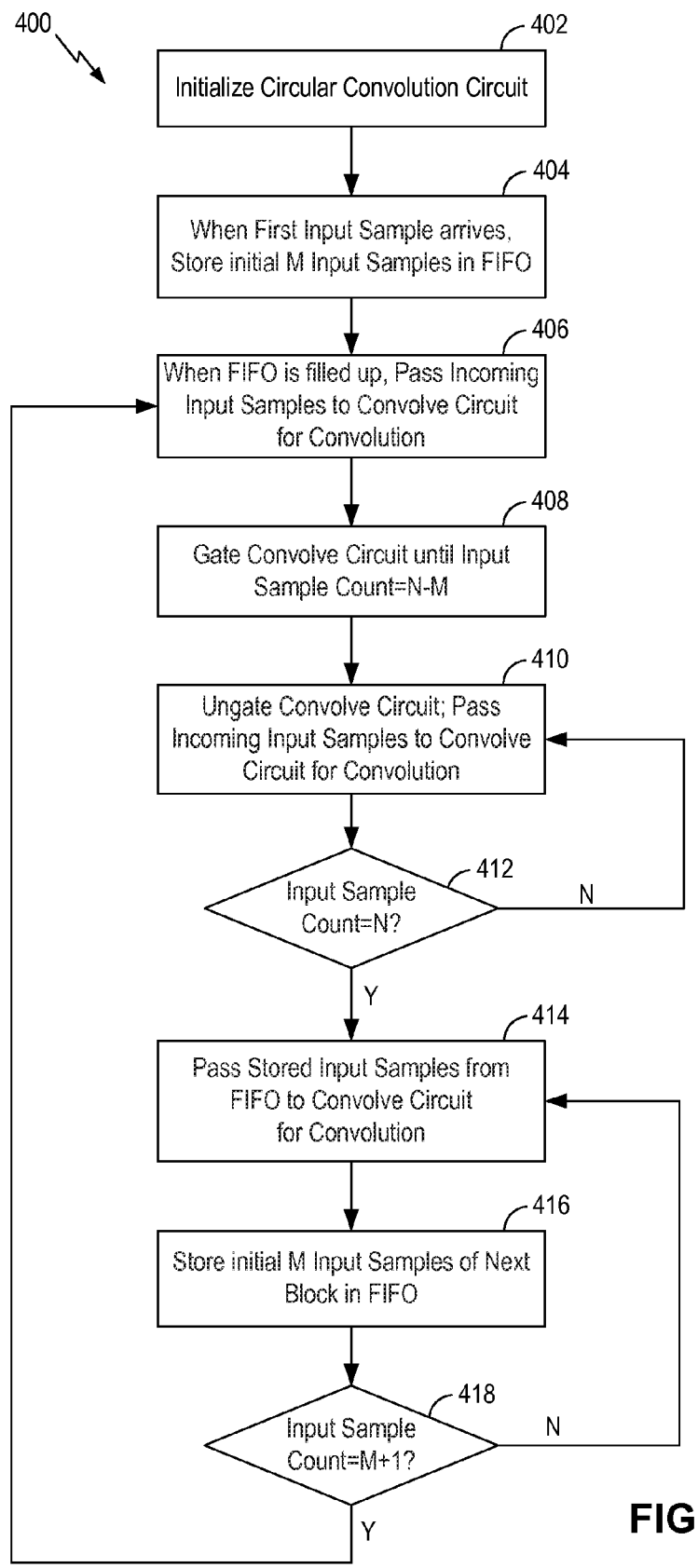
FIG. 6 is a flow chart illustrating the circular convolution method according to an alternate embodiment of the present invention.
Figure 7:
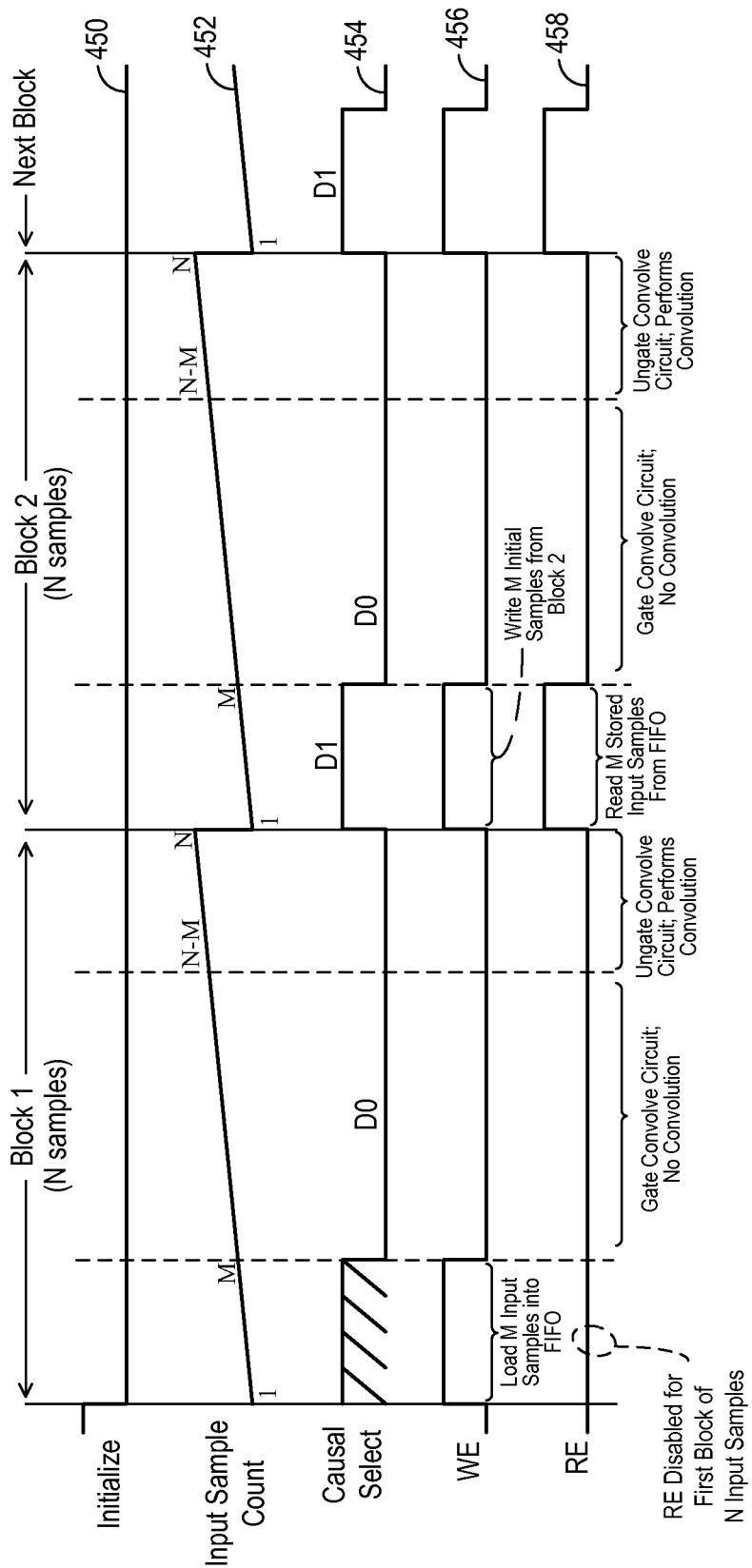
FIG. 7 is a timing diagram of the signals in the circuit convolution circuit of FIG. 1 according to an alternate embodiment of the present invention.

FIG. 6 is a flow chart illustrating the circular convolution method according to an alternate embodiment of the present invention. FIG. 7 is a timing diagram of the signals in the circuit convolution circuit of FIG. 1 according to an alternate embodiment of the present invention. Referring to FIG. 6, circular convolution method 400 is implemented in a similar manner as circular convolution method 300 except that method 400 operates with gating of the FIR filter of the convolve circuit. Method 400 starts with initializing the circular convolution circuit (step 402). Then, for the first block of N input samples, the first M input samples are stored into the FIFO (step 404). Then, when the FIFO is filled up, the incoming input samples are passed to the convolve circuit for convolution (step 406). However, referring to FIG. 7, at this time, the convolve circuit may be gated until the input sample count reaches N−M, where N is the block size and M is the size of the FIR (step 408). Thus, no convolution is computed during this time. Then the sample count reaches N−M, the convolve circuit is ungated and the incoming input samples are passed to the convolve circuit for convolution (step 410).

The operation of circular convolution circuit 400 continues with performing convolution of the incoming input samples until the sample count reaches N (step 412). Then, the stored input samples, being the M initial input samples of the first block, are provided to the convolve circuit for convolution (step 414). Meanwhile, the first M samples of the next block are stored into the FIFO (step 416). Steps 414 and 416 are repeated until all of the stored samples from the previous block have been read out of FIFO 116 and FIFO 116 is filled with the M initial input samples of the next block for use to perform convolution at the end of this block. When the input sample count reaches M+1 (step 418), method 400 repeats at step 406 where the incoming input samples are passed to the convolve circuit for convolution. However, at step 408, the convolve circuit is gated until input sample count N−M is reached.

Circuitry such as that described above may be used in apparatus that performs circular convolution on a block of samples received in streaming mode. In particular, the circuitry can be implemented in a repeater configured to extend communication between network infrastructure (such as cellular base stations, WiFi access points, etc.) and user devices (such as cellular telephones, computers, personal data assistants, or any other devices configured to at least receive signals from infrastructure). In general, repeaters receive, amplify, and transmit signals. In a repeater implementation, the input samples are generated based on signals received at the repeater from the infrastructure or user device, and the circular convolution of the input signal with a finite impulse response is computed.

In a repeater, the receive circuitry can include circuitry to receive signals from one or more antennae. The circuitry may sample the input signals, so that generated samples can be processed in the repeater (e.g., in the circular convolution techniques described herein).

Those skilled in the art will understand that information and signals may be represented using any of a variety of different technologies and techniques. For example: data, information, signals, bits, symbols, chips, instructions, and commands may be referenced throughout the above description. These may be represented by voltages, currents, electromagnetic waves, magnetic fields or particles, optical fields or particles, or any combination thereof.

In one or more exemplary embodiments, the functions and processes described may be implemented in hardware, software, firmware, or any combination thereof. If implemented in software, the functions may be stored on computer-readable media as one or more instructions or code. Computer-readable media includes storage media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media. The phrase "computer-readable media" does not embrace transitory propagating signals. The term "control logic" used herein applies to software (in which functionality is implemented by instructions stored on a machine-readable medium to be executed using a processor), hardware (in which functionality is implemented using circuitry (such as logic gates), where the circuitry is configured to provide particular output for particular input, and firmware (in which functionality is implemented using re-programmable circuitry), and also applies to combinations of one or more of software, hardware, and firmware.

For a firmware and/or software implementation, the methodologies may be implemented with modules (e.g., procedures, functions, and so on) that perform the functions described herein. Any machine readable medium tangibly embodying instructions may be used in implementing the methodologies described herein. For example, software codes may be stored in a memory, for example the memory of mobile station or a repeater, and executed by a processor, for example the microprocessor of modem. Memory may be implemented within the processor or external to the processor. As used herein the term "memory" refers to any type of long term, short term, volatile, nonvolatile, or other memory and is not to be limited to any particular type of memory or number of memories, or type of media upon which memory is stored.

The current circuitry may be used in wireless environments such as a wireless wide area network (WWAN), a wireless local area network (WLAN), a wireless personal area network (WPAN), and so on. The term "network" and "system" may be used interchangeably herein. A WWAN may be a Code Division Multiple Access (CDMA) network, a Time Division Multiple Access (TDMA) network, a Frequency Division Multiple Access (FDMA) network, an Orthogonal Frequency Division Multiple Access (OFDMA) network, a Single-Carrier Frequency Division Multiple Access (SC-FDMA) network, and so on. A CDMA network may implement one or more radio access technologies (RATs) such as cdma2000, Wideband-CDMA (W-CDMA), Time Division Synchronous Code Division Multiple Access (TD-SCDMA), to name just a few radio technologies. Here, cdma2000 may include technologies implemented according to IS-95, IS-2000, and IS-856 standards. A TDMA network may implement Global System for Mobile Communications (GSM), Digital Advanced Mobile Phone System (D-AMPS), or some other RAT. GSM and W-CDMA are described in documents from a consortium named "3rd Generation Partnership Project" (3GPP). Cdma2000 is described in documents from a consortium named "3rd Generation Partnership Project 2" (3GPP2). 3GPP and 3GPP2 documents are publicly available. A WLAN may include an IEEE 802.11x network, and a WPAN may include a Bluetooth network, an IEEE 802.15x, for example. Wireless communication networks may include so-called next generation technologies (e.g., "4G"), such as, for example, Long Term Evolution (LTE), Advanced LTE, WiMAX, Ultra Mobile Broadband (UMB), and/or the like. In addition to or as an alternative to such example WWAN, WLAN technologies and the like, in certain example implementations, assistance information (e.g., TOW-Assist, etc.) may be transmitted to device 202 via a broadcast technology such as MediaFLO, ISDB-T, DVB-H, and/or the like.

Moreover, the previous description of the disclosed implementations is provided to enable any person skilled in the art to make or use the present invention. Various modifications to these implementations will be readily apparent to those skilled in the art, and the generic principles defined herein may be applied to other implementations without departing from the spirit or scope of the invention. Thus, the present invention is not intended to be limited to the features shown herein but is to be accorded the widest scope consistent with the principles and novel features disclosed herein.

What is claimed is:

1. A circuit for computing the circular convolution of an input signal with a finite impulse response, comprising:
    a first-in-first-out (FIFO) memory circuit configured to store M number of incoming input samples of the input signal in response to a first control signal and to provide stored input samples in response to a second control signal, M being the length of the finite impulse response;
    a multiplexer configured to receive the incoming input samples of the input signal as a first data input and the stored input samples from the FIFO memory circuit as a second data input, the multiplexer further configured to receive a third control signal as a select signal, the multiplexer operative to select either the first data input or the second data input as a data output in response to the select signal;
    a controller configured to generate the first, second and third control signals; and
    a convolve circuit configured to compute the convolution of the data output of the multiplexer and the finite impulse response, thereby generating circular convolution output samples, the convolution being performed on blocks of N number of input samples of the input signal, N being greater than M, wherein the controller is operative to generate the first control signal to cause the initial M input samples of each block of N input samples to be stored in the FIFO memory circuit as the stored input samples, to generate the third control signal to cause the (M+1)th to Nth input samples of each block to be provided to the convolve circuit for computing the convolution and after the Nth input sample of each block, to generate the second control signal to cause the M stored input samples to be provided to the convolve circuit for convolution with the finite impulse response, the convolve circuit further configured to be disabled for the (M+1)th to (N−M)th incoming input samples of each block of the input signal, and the convolve circuit is operative to compute the convolution of the data output of the multiplexer and the finite impulse response for the (N−M+1)th to Nth incoming input samples of each block and for the M stored input samples provided after the Nth input sample of each block, wherein the first control signal is asserted for the initial M input samples of the input signal and the second control signal is deasserted for the first block of input samples and is asserted for the initial M input samples of the input signal for subsequent blocks of input samples.

2. The circuit of claim 1, wherein the controller is further operative to generate the first control signal to cause the initial M input samples of the next block of the incoming input samples to be stored in the FIFO memory circuit while the M stored input samples in the FIFO memory circuit are being provided to the convolve circuit.

3. The circuit of claim 2, wherein the controller is operative to cause the M stored input samples in the FIFO memory circuit to be provided to the convolve circuit to compute the convolution while the initial M incoming input samples of the current block is being stored in the FIFO memory circuit.

4. The circuit of claim 1, wherein the third control signal is asserted for the initial M input samples of the input signal to cause the multiplexer to select the stored input samples as the data output and is deasserted for the (M+1)th to Nth input samples to cause the multiplexer to select the incoming input samples as the data output.

5. The circuit of claim 1, wherein N is greater than or equal to 2M.

6. A circuit for computing the circular convolution of an input signal with a finite impulse response, comprising:
first means for storing M number of incoming input samples of the input signal in response to a first control signal and for providing stored input samples in response to a second control signal, M being the length of the finite impulse response;
second means for receiving the incoming input samples of the input signal as a first data input and the stored input samples from the first means circuit as a second data input, the second means further receiving a third control signal as a select signal, the second means selecting either the first data input or the second data input as a data output in response to the select signal;
third means for generating the first, second and third control signals; and
fourth means for computing the convolution of the data output of the second means and the finite impulse response, thereby generating circular convolution output samples, the convolution being performed on blocks of N number of input samples of the input signal, N being greater than M, wherein the third means is operative to generate the first control signal to cause the initial M input samples of each block of N input samples to be stored in the first means as the stored input samples, to generate the third control signal to cause the (M+1)th to Nth input samples of each block to be provided to the fourth means for computing the convolution and after the Nth input sample of each block, to generate the second control signal to cause the M stored input samples to be provided to the fourth means for convolution with the finite impulse response, the fourth means further configured to be disabled for the (M+1)th to (N−M)th incoming input samples of each block of the input signal, and the fourth means is operative to compute the convolution of the data output of the multiplexer and the finite impulse response for the (N−M+1)th to Nth incoming input samples of each block and for the M stored input samples provided after the Nth input sample of each block, wherein the first control signal is asserted for the initial M input samples of the input signal and the second control signal is deasserted for the first block of input samples and is asserted for the initial M input samples of the input signal for subsequent blocks of input samples.

7. A method for computing the circular convolution of an input signal with a finite impulse response, comprising:
receiving incoming input samples of the input signal;
in response to a first control signal, storing initial M incoming input samples in a first-in-first-out manner at a FIFO memory circuit, and to provide stored input samples in response to a second control signal, M being the length of the finite impulse response;
selecting the incoming input samples of the input signal as a first data input and the stored input samples from the FIFO memory circuit as a second data input, the selection based from a third control signal for providing one of the first data input and the second data input as a data output in response to the third control signal;
providing the first, second, and third control signals to control the circular convolution;
providing the first control signal to cause the initial M input samples of each block of N input samples to be stored in the FIFO memory circuit as the stored input samples, providing the third control signal to provide the (M+1)th to Nth incoming input samples of each block for convolution with the finite impulse response at a convolve circuit, the convolution being performed on blocks of N number of input samples of the input signal, N being greater than M, in response to the second control signal, providing the M stored input samples in a first-in-first-out manner for convolution with the finite impulse response, thereby generating circular convolution output samples, the convolve circuit configured to be disabled for the (M+1)th to (N−M)th incoming input samples of each block of the input signal, and the convolve circuit is operative to compute the convolution of the data output of the multiplexer and the finite impulse response for the (N−M+1)th to Nth incoming input samples of each block and for the M stored input samples provided after the Nth input sample of each block, wherein the first control signal is asserted for the initial M input samples of the input signal and the second control signal is deasserted for the first block of input samples and is asserted for the initial M input samples of the input signal for subsequent blocks of input samples.

8. The method of claim 7, further comprising:
while providing the M stored input samples in a first-in-first-out manner for convolution, storing initial M input samples of the next block of the incoming input samples in a first-in-first-out manner.

9. The method of claim 7, wherein N is greater than or equal to 2M.

10. A computer-readable medium comprising instructions, which, when executed by a computer, cause the computer to perform operations, the instructions comprising:
receiving incoming input samples of the input signal;
in response to a first control signal, storing initial M incoming input samples in a first-in-first-out manner, and to provide stored input samples in response to a second control signal, M being the length of the finite impulse response;
selecting the incoming input samples of the input signal as a first data input and the stored input samples as a second data input, the selection based from a third control signal for providing one of the first data input and the second data input as a data output in response to the third control signal;

providing the first, second, and third control signals to control the circular convolution;

providing the first control signal to cause the initial M input samples of each block of N input samples to be stored as the stored input samples, providing the third control signal to provide the (M+1)th to Nth incoming input samples of each block for convolution with the finite impulse response, the convolution being performed on blocks of N number of input samples of the input signal, N being greater than M, in response to the second control signal, providing the M stored input samples in a first-in-first-out manner for convolution with the finite impulse response, thereby generating circular convolution output samples, the convolution configured to be disabled for the (M+1)th to (N−M)th incoming input samples of each block of the input signal, and the convolution is operative to compute the convolution of the data output of the multiplexer and the finite impulse response for the (N−M+1)th to Nth incoming input samples of each block and for the M stored input samples provided after the Nth input sample of each block, wherein the first control signal is asserted for the initial M input samples of the input signal and the second control signal is deasserted for the first block of input samples and is asserted for the initial M input samples of the input signal for subsequent blocks of input samples.

11. A computer-readable medium including program code containing instructions stored thereon, which when executed by a computer cause the computer to perform operations comprising:

program code containing instructions for receiving incoming input samples of the input signal;

program code containing instructions for storing initial M incoming input samples in a first-in-first-out manner in response to a first control signal, and to provide stored input samples in response to a second control signal, M being the length of the finite impulse response;

program code containing instructions for selecting the incoming input samples of the input signal as a first data input and the stored input samples as a second data input, the selection based from a third control signal for providing one of the first data input and the second data input as a data output in response to the third control signal;

program code containing instructions for providing the first, second, and third control signals to control the circular convolution;

program code containing instructions for providing the first control signal to cause the initial M input samples of each block of N input samples to be stored as the stored input samples, providing the third control signal to provide the (M+1)th to Nth incoming input samples of each block for convolution with the finite impulse response, the convolution being performed on blocks of N number of input samples of the input signal, N being greater than M, in response to the second control signal, providing the M stored input samples in a first-in-first-out manner for convolution with the finite impulse response, thereby generating circular convolution output samples, the convolution configured to be disabled for the (M+1)th to (N−M)th incoming input samples of each block of the input signal, and the convolution operative to compute the convolution of the data output of the multiplexer and the finite impulse response for the (N−M+1)th to Nth incoming input samples of each block and for the M stored input samples provided after the Nth input sample of each block, wherein the first control signal is asserted for the initial M input samples of the input signal and the second control signal is deasserted for the first block of input samples and is asserted for the initial M input samples of the input signal for subsequent blocks of input samples.

12. A repeater comprising:

receive circuitry to receive input signals and to generate a plurality of input samples based on the received input signals;

circuitry to perform circular convolution of N input samples with N finite impulse response samples, wherein the circuitry comprises:

a first-in-first-out (FIFO) memory circuit configured to store M number of incoming input samples of the input signal in response to a first control signal and to provide stored input samples in response to a second control signal, M being the length of the finite impulse response;

a multiplexer configured to receive the incoming input samples of the input signal as a first data input and the stored input samples from the FIFO memory circuit as a second data input, the multiplexer further configured to receive a third control signal as a select signal, the multiplexer operative to select either the first data input or the second data input as a data output in response to the select signal;

a controller configured to generate the first, second and third control signals; and a convolve circuit configured to compute the convolution of the data output of the multiplexer and the finite impulse response, thereby generating circular convolution output samples, the convolution being performed on blocks of N number of input samples of the input signal, N being greater than M, wherein the controller is operative to generate the first control signal to cause the initial M input samples of each block of N input samples to be stored in the FIFO memory circuit as the stored input samples, to generate the third control signal to cause the (M+1)th to Nth input samples of each block to be provided to the convolve circuit for computing the convolution and after the Nth input sample of each block, to generate the second control signal to cause the M stored input samples to be provided to the convolve circuit for convolution with the finite impulse response, the convolve circuit further configured to be disabled for the (M+1)th to (N−M)th incoming input samples of each block of the input signal, and the convolve circuit is operative to compute the convolution of the data output of the multiplexer and the finite impulse response for the (N−M+1)th to Nth incoming input samples of each block and for the M stored input samples provided after the Nth input sample of each block, wherein the first control signal is asserted for the initial M input samples of the input signal and the second control signal is deasserted for the first block of input samples and is asserted for the initial M input samples of the input signal for subsequent blocks of input samples.

13. A repeater comprising:

means for receiving input signals;

means for generating a plurality of input samples based on the received input signals;

means for performing circular convolution of N input samples with N finite impulse response samples, wherein the means for performing circular convolution comprises:

first means for storing M number of incoming input samples of the input signal in response to a first control signal and for providing stored input samples in response to a second control signal, M being the length of the finite impulse response;

second means for receiving the incoming input samples of the input signal as a first data input and the stored input samples from the first means circuit as a second data input, the second means further receiving a third control signal as a select signal, the second means selecting either the first data input or the second data input as a data output in response to the select signal;

third means for generating the first, second and third control signals; and fourth means for computing the convolution of the data output of the second means and the finite impulse response, thereby generating circular convolution output samples, the convolution being performed on blocks of N number of input samples of the input signal, N being greater than M, wherein the third means is operative to generate the first control signal to cause the initial M input samples of each block of N input samples to be stored in the first means as the stored input samples, to generate the third control signal to cause the (M+1)th to Nth input samples of each block to be provided to the fourth means for computing the convolution and after the Nth input sample of each block, to generate the second control signal to cause the M stored input samples to be provided to the fourth means for convolution with the finite impulse response, the fourth means further configured to be disabled for the (M+1)th to (N−M)th incoming input samples of each block of the input signal, and the fourth means is operative to compute the convolution of the data output of the multiplexer and the finite impulse response for the (N−M+1)th to Nth incoming input samples of each block and for the M stored input samples provided after the Nth input sample of each block, wherein the first control signal is asserted for the initial M input samples of the input signal and the second control signal is deasserted for the first block of input samples and is asserted for the initial M input samples of the input signal for subsequent blocks of input samples.

* * * * *